US012008706B2

(12) United States Patent
Lee

(10) Patent No.: US 12,008,706 B2
(45) Date of Patent: Jun. 11, 2024

(54) METHOD AND DEVICE FOR GENERATING IMAGE DATA FOR MACHINE LEARNING

(71) Applicant: T.I.M SOLUTION CO., LTD, Ulsan (KR)

(72) Inventor: Gye Hong Lee, Ulsan (KR)

(73) Assignee: T.I.M SOLUTION CO., LTD, Ulsan (KR)

( * ) Notice: Subject to any disclaimer, the term of this patent is extended or adjusted under 35 U.S.C. 154(b) by 0 days.

(21) Appl. No.: 18/249,151

(22) PCT Filed: Nov. 30, 2020

(86) PCT No.: PCT/KR2020/017247
§ 371 (c)(1),
(2) Date: Apr. 14, 2023

(87) PCT Pub. No.: WO2022/058859
PCT Pub. Date: Apr. 28, 2022

(65) Prior Publication Data
US 2023/0326121 A1    Oct. 12, 2023

(30) Foreign Application Priority Data
Oct. 21, 2020    (KR) .......................... 10-2020-0136379

(51) Int. Cl.
G06T 15/10    (2011.01)
G06F 30/27    (2020.01)
G06T 7/00    (2017.01)

(52) U.S. Cl.
CPC .............. *G06T 15/10* (2013.01); *G06F 30/27* (2020.01); *G06T 7/001* (2013.01); *G06T 2207/20081* (2013.01); *G06T 2207/30108* (2013.01)

(58) Field of Classification Search
CPC ...................... G06T 7/001; G06T 15/10; G06T 2207/20081; G06T 2207/30108; G06F 30/27
See application file for complete search history.

(56) References Cited

U.S. PATENT DOCUMENTS

| RE42,715 E | * | 9/2011 | Sones ................ G01N 21/8806 |
| | | | 382/218 |
| 9,019,268 B1 | | 4/2015 | Kuffner, Jr. et al. |

(Continued)

FOREIGN PATENT DOCUMENTS

| KR | 10-2014-0059720 A | 5/2014 |
| KR | 101445973 B1 | 10/2014 |

(Continued)

OTHER PUBLICATIONS

Son, Myeong Jo et al., Jun. 2016 Vol. 21, No. 2, pp. 186-195. Development of 3D CAD/CAE Interface in Initial Structural Design Phase of Shipbuilding. International Journal of CAD/CAM. It Convergence Research Team, Korean Register Technology Headquarters Research Institute. Retrieved from <URL: https://www.koreascience.or.kr/article/JAKO201616853626710.pdf>. See pp. 187-188.

(Continued)

*Primary Examiner* — Phi Hoang
(74) *Attorney, Agent, or Firm* — NKL Law; Byungwoong Park

(57) ABSTRACT

Provided are a method and an apparatus for generating image data for machine learning. The method may include extracting first image data for a product generated as a result of conducting a first step among a plurality of steps of a manufacturing process of a product based on 3D CAD data for the product, generating a plurality of posture conversion image sets corresponding to a plurality of postures for the product, respectively, based on the first image data, perform- (Continued)

ing image processing through a rendering engine by applying actual image data to respective images of the plurality of posture conversion image sets, and generating a learning data set for the first image data through the image processing.

12 Claims, 6 Drawing Sheets

(56) References Cited

U.S. PATENT DOCUMENTS

| | | | | |
|---|---|---|---|---|
| 11,640,692 B1* | 5/2023 | Gowda | ..................... | G06T 7/11 |
| | | | | 345/419 |
| 2014/0079314 A1* | 3/2014 | Yakubovich | ....... | G06V 10/7625 |
| | | | | 382/155 |
| 2016/0104070 A1* | 4/2016 | Eslami | ..................... | G06N 7/01 |
| | | | | 706/12 |
| 2020/0211276 A1 | 7/2020 | Mehr et al. | | |
| 2020/0279008 A1* | 9/2020 | Jain | ........................ | G06F 16/954 |
| 2021/0201526 A1* | 7/2021 | Moloney | ................ | G06N 3/082 |

FOREIGN PATENT DOCUMENTS

| | | |
|---|---|---|
| KR | 10-2020-0027885 A | 3/2020 |
| KR | 10-2020-0032090 A | 3/2020 |
| KR | 102086351 B1 | 5/2020 |

OTHER PUBLICATIONS

Written Opinion of the International Searching Authority, dated Jul. 6, 2021.
Patent Decision of KIPO for Korean application No. 1020200163840, dated Mar. 27, 2023.

* cited by examiner

METHOD AND DEVICE FOR GENERATING IMAGE DATA FOR MACHINE LEARNING

TECHNICAL FIELD

The present disclosure relates to a method for generating image data for machine learning, and an apparatus thereof. More particularly, the present disclosure relates to a method for generating image data for machine learning based on 3D CAD, and an apparatus thereof.

BACKGROUND ART

In recent years, machine learning technology has been actively used in various ICT service areas based on artificial intelligence, and the application field has been expanding to various industries. Since the quality of the result of this machine learning technology is determined by an amount of learning for a learning target, securing big data that is subject to machine learning is an important task for the output quality collateral.

The big data for such machine learning is easy to secure images in the field of service industry for the public. On the other hand, in the case of a manufacturing business, it is difficult to secure images before the launch of new products due to a security issue, and it is especially impossible to secure the image of a manufacturing process thereof.

In particular, in the case of on-demand products such as ships, the shapes of ships are all different by the orders of the owner. Useless data to the manufacturing of new ships which are being built is made when machine-learning is performed with existing ship images. Furthermore, the image of the existing ship provides only a final state of the building completed, and a limitation that does not reflect the data of the manufacturing process of the ship is exposed.

This kind of problem excludes the manufacturing industry from the application field of machine learning, and inhibits innovation in the manufacturing site.

DISCLOSURE

Technical Problem

A technical object to be solved by the present disclosure is to provide a method and an apparatus for mass-generating learning image data reflecting a manufacturing process of an on-demand product for which ready-made article does not exist. Specifically, an object of the present disclosure is to provide a method and an apparatus for generating image data for machine learning for identifying a process progress situation of an intermediate output calculated in each step of a ship building process to which a large block is applied.

Another technical object to be solved by the present disclosure is to provide a method and an apparatus for mass-generating image data for machine learning based on 3D CAD. Specifically, an object of the present disclosure is to provide a method and an apparatus for light-weighting 3D CAD data to which an inherent attribute of an on-demand large product is reflected and generating image data for training based on light-weighted 3D CAD data.

Yet another technical object to be solved by the present disclosure is to provide a method and an apparatus for monitoring an actual process of a product. Specifically, an object of the present disclosure is to provide a method and an apparatus for comparing a photographed image of a detailed step of the actual process and a machine learning result for the generated 3D CAD based learning image data to monitor a progress rate of a current actual process.

The technical objects of the present disclosure are not restricted to the aforementioned technical objects, and other objects of the present disclosure, which are not mentioned above, will be able to be apparently appreciated by those skilled in the art in the technical field of the present disclosure by referencing the description of the present disclosure given below.

Technical Solution

In order to solve the technical problem, a method for generating image data for machine learning may include: extracting first image data for a product generated as a result of conducting a first step among a plurality of steps of a manufacturing process of a product, based on 3D CAD data for the product; generating a plurality of posture conversion image sets corresponding to a plurality of postures for the product, respectively, based on the first image data; performing image processing through a rendering engine by applying actual image data to respective images of the plurality of posture conversion image sets; and generating a learning data set for the first image data through the image processing.

In an exemplary embodiment, the extracting the first image data may include matching the 3D CAD data for the product with a first data group including identification information of the product, identification information of a finished product including the product, and information on each step of the manufacturing process.

In an exemplary embodiment, the extracting the first image data may include matching the first image data with a second data group including the identification information of the product, identification information of an intermediate output constituting the product, and information on a process progress rate of the first step compared with the plurality of steps of the manufacturing process.

In an exemplary embodiment, the generating the plurality of posture conversion image sets may include performing predetermined viewpoint conversion for the first image data, and capturing the viewpoint-converted first image data.

In an exemplary embodiment, the performing the image processing through the rendering engine by applying the actual image data may include receiving physical value information, environment value information, and noise information corresponding to the first step from an infrastructure network database storing the site information corresponding to the first step, and generating the actual image data based on the received information.

In an exemplary embodiment, the performing the image processing through the rendering engine may include determining a rendering model based on the plurality of posture conversion image sets and the actual image data, performing the image processing based on the determined rendering model, generating a third data group including the applied actual image data and information on the determined rendering model, and matching the third data group with a learning data set for the first image data.

In an exemplary embodiment, the site information may include process information corresponding to the first step, and the method may include: filtering the received site information based on the process information, and performing reinforcement learning for the learning data set based on the filtered site information, and the performing the reinforcement learning may include generating simulation data to be applied to learning data through pre-registered reinforcement learning model based on the filtered site information, and applying the simulation data to the learning data set.

In an exemplary embodiment, the filtering the received site information based on the process information may include extracting pre-matched noise information based on at least one of the process type and the progress direction of the process among the process information, and filtering the site information based on the pre-matched noise information.

In an exemplary embodiment, the extracting the first image data may include identifying a hierarchy of the 3D CAD model for the product, performing a CAD light-weighting process of light-weighting an object determined as a merge target among objects constituting the hierarchy, and generating the 3D CAD data of the product by performing the CAD light-weighting process.

In an exemplary embodiment, the performing the CAD light-weighting process of light-weighting the object determined as the merge target among the objects constituting the hierarchy may include determining the merge target among the objects based on the manufacturing process of the product.

In an exemplary embodiment, the method may further include: extracting second image data for a product generated as a result of conducting a second step among the plurality of steps of the manufacturing process of the product; generating a plurality of posture conversion image sets of the second image data corresponding to a plurality of postures for the product, respectively, based on the second image data; performing image processing through a rendering engine by applying actual image data to respective images of the plurality of posture conversion image sets of the second image data; and generating a learning data set for the second image data through the image processing.

In order to solve the technical problem, an apparatus for generating image data for machine learning may include: one or more processors; a network interface receiving 3D CAD data for a product and site information; a memory loading a computer program executed by the processor; and a storage storing the computer program, and the computer program may include an operation of extracting first image data for a product generated as a result of conducting a first step among a plurality of steps of during the manufacturing process of a product based on the 3D CAD data, an operation of generating a plurality of posture conversion image sets corresponding to a plurality of postures for the product, respectively, based on the first image data, an operation of performing image processing through a rendering engine by applying actual image data to respective images of the plurality of posture conversion image sets, and an operation of generating a learning data set for the first image data through the image processing.

Advantageous Effects

According to an exemplary embodiment of the present disclosure, there is an advantage in that learning data for a product for which a ready-made article does exist, but only a design drawing exists to expand an application range of machine learning. According to the exemplary embodiment of the present disclosure, application of machine learning to an on-demand product which has not been produced is enabled to maximize innovation of a manufacturing site.

Further, according to another exemplary embodiment of the present disclosure, there is an effect that a completion degree of an intermediate output of each step of a manufacturing process is confirmed through machine-learned image data to analyze a progress rate for each step of the process.

Further, according to yet another exemplary embodiment of the present disclosure, there is an advantage in that 3D CAD data requiring many computing resources is light-weighted to quickly mass-generate the image data for machine learning.

MODE FOR INVENTION

Figure 1:
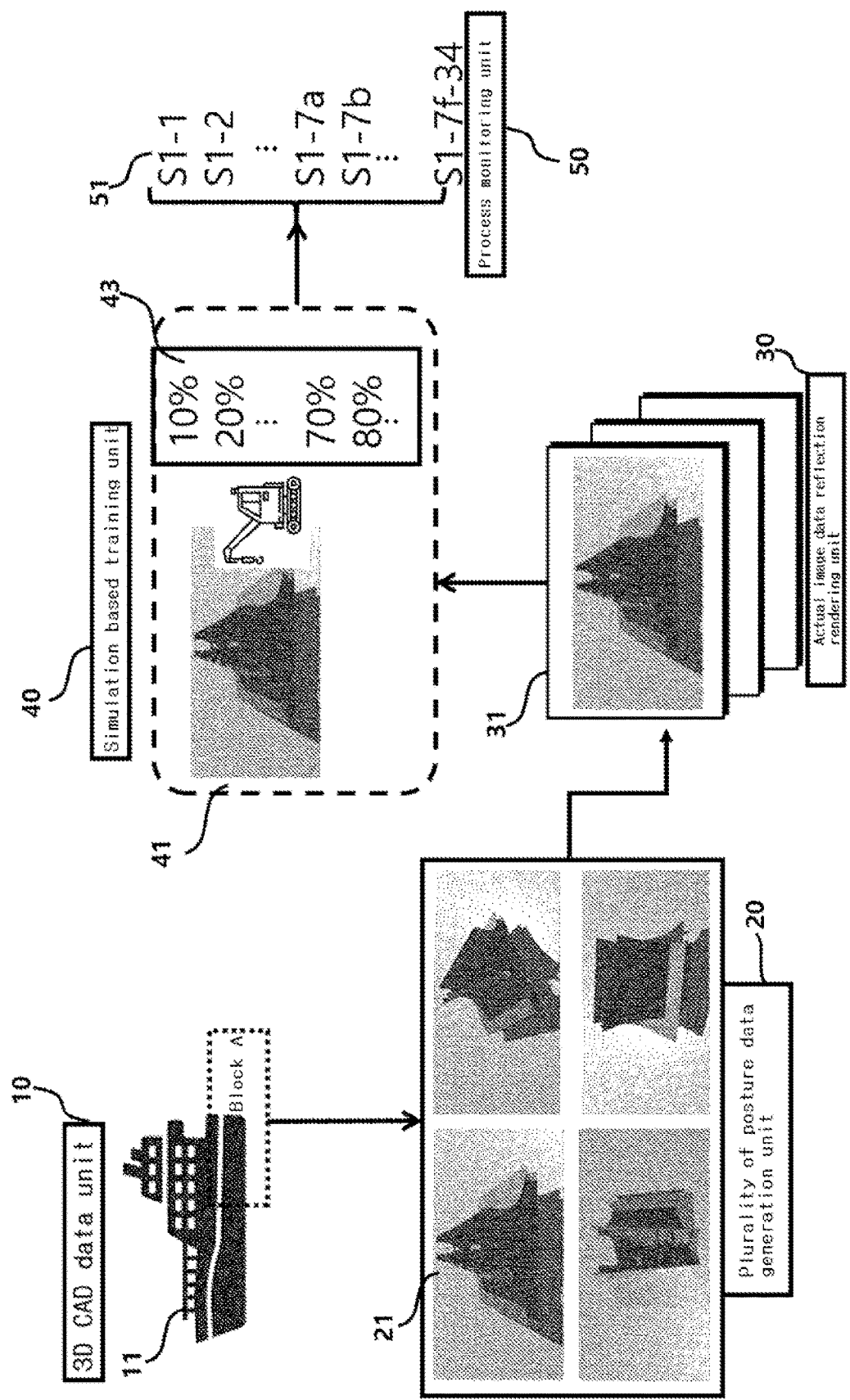
FIG. 1 is a conceptual view of a system for generating image data for machine learning according to an exemplary embodiment of the present disclosure.

Hereinafter, preferred embodiments of the present disclosure will be described in detail with reference to the accompanying drawings. Advantages and features of the present disclosure, and methods for accomplishing the same will be more clearly understood from embodiments described in detail below with reference to the accompanying drawings. However, the present disclosure is not limited to the embodiments set forth below, and may be embodied in various different forms. The present embodiments are just for rendering the disclosure of the present disclosure complete and are set forth to provide a complete understanding of the scope of the disclosure to a person with ordinary skill in the technical field to which the present disclosure pertains, and the present disclosure will only be defined by the scope of the claims. Throughout the whole specification, the same reference numerals denote the same elements.

If there are no other definitions, all the terms used herein (including technical and scientific terms) may be used as a meaning which may be commonly appreciated by those skilled in the art in a technical field to which the present disclosure belongs. In addition, the terms that are commonly used and defined in the dictionary are not ideally or excessively interpreted unless they are clearly defined. The terms used herein are intended to explain the exemplary embodiments and are not to limit the present disclosure.

In the present disclosure, a singular type also includes a plural type unless particularly mentioned in a phrase.

In the present disclosure, a product which is produced through a specific process and may be, for example, a large block applied to a ship. In this case, the ship as a finished product may be achieved by assembling or combining between various products.

In addition, in the present disclosure, an intermediate output is an output produced as each step of a process for producing the product, and may be a product in an unfinished state or a partial component of the product. For example, when the product is a large block, the large block is produced by assembling and welding various steel plates and structures, and some assemblies of the steel plates and structures may be intermediate outputs. In the above example, when a process of 10 steps is performed in producing the product, the output between the first to ninth steps may be the intermediate output.

Hereinafter, a system, an apparatus, and a method for generating image data for machine learning may be referred to as an image data generation system, an image data generation apparatus, and an image data generation method, respectively.

FIG. 1 is a conceptual view of a system for generating image data for machine learning according to an exemplary embodiment of the present disclosure. Referring to FIG. 1, the image data generation system may include a 3D CAD data unit 10, a plurality of posture data generation units 20, an actual image data reflection rendering unit 30, a simulation based training unit 40, and a process monitoring unit 50.

Each component of the system may be a hard device or a hardware device storing and computing software performing each function, and components separately illustrated in FIG. 1 may also be constituted by one hardware device.

As another example, each component of the system may also be a software module that are integrated into one hardware computing device and performs each function.

The 3D CAD data unit 10 may be, for example, a device that provides design data that provides the product or a finished product, and in particular, in the present disclosure, 3D CAD data may be 3D design drawing data 11 of a ship produced by assembling large blocks having various shapes.

According to an exemplary embodiment, the 3D design drawing data 11 of the ship may be 3D CAD light-weighted processed data.

That is, a 3D CAD model of the product such as the ship is constituted by many vertexes, parts (3D CAD model hierarchical objects), a material configuring each part, and a property. The reason is that since most 3D CAD models are made for product production, a precision represented by the number of vertexes or the object hierarchy is generally even higher than a 3D CAD model produced in an entertainment industry such as movies, and games.

Excessive data due to the high precision and the attribute information (a length, a diameter, or a material) granted for each object causes a problem in that the 3D CAD model is driven only in a high-specification device or only a limited function is implemented in a low-specification device.

Therefore, the image data generation apparatus 100 according to an exemplary embodiment of the present disclosure may process a CAD light-weighting process of identifying a hierarchy of the 3D CAD model for the product, and light-weighting an object determined to be merged among objects constituting the hierarchy.

As the light-weighting process is performed, the image data generation apparatus 100 may generate the 3D design drawing data 11 of the light-weighted ship from the 3D CAD model for the product.

In an exemplary embodiment, a merge target among the objects may also be determined based on a manufacturing process for the product. That is, the image data generation apparatus 100 may perform light-weighting so as to reflect a structure which should be at least maintained in order to reflect a manufacturing process of the ship. The light-weighting degree may be set by a user of the image data generation apparatus 100.

The 3D CAD data unit 10 may extract 3D CAD data of a block unit constituting the ship from the 3D design drawing data 11.

When the product is the block, the 3D CAD data unit 10 may extract CAD image data for each detailed steps included in the manufacturing process of each block. As an example, it will be described a case that the CAD image data for block A is extracted from the 3D data unit 10.

The 3D CAD data unit 10 may implement an assembly process of block A and steel plates and structures constituting block A as the CAD image data.

In particular, in the case of total 3 steps of the manufacturing process of block A, a base steel plate is placed in step 1, a left pole steel plate is assembled to a left side of the base steel plate in step 2, and a right pole steel plate is assembled to a right side of the base steel plate in step 3. It will be described that block A is manufactured in this order. In this case, the 3D CAD data unit 10 may extract CAD image data for block A in which only an initial base steel plate is placed as the CAD image data, and secondly extract the CAD image data in which a left steel plate is assembled to the base steel plate. The 3D CAD data unit 10 may finally extract CAD image data in which up to a right steel plate is assembled to the base steel plate.

The extracted 3D CAD image data of the block unit is provided to the plurality of posture data generation unit 20.

In each step of the block manufacturing process, a direction in which the block is rotated or placed, and a task direction may be diversified, and the plurality of posture data generation unit 20 may generate various posture data 21 for the 3D CAD data for the block. In this case, various posture data are CAD image data that expresses a subject viewed when variously converting a viewpoint of viewing the image data or rotating the block in various directions. To this end, the plurality of posture data generation units 20 may generate various directional posture data while rotating 360 degrees and capturing the image data of the product or the intermediate output.

The actual image data reflection rendering unit 30 reflects actual image data such as environmental information such as weather, time zone, and welding firework, noise information such as people and facilities, and physical information such as a block material in which the manufacturing process is conducted, a paint color, the type and location of a light source to a plurality of posture data, and performs image rendering for various directional posture data. The actual image data reflection rendering unit 30 may acquire actual image data from an infrastructure network that records site information or acquires the site information in real time. Here, the infrastructure network may be a network interface capable of acquiring various site information such as types and locations of facilities, cameras, and light sources installed at a site, and process information. That is, the infrastructure network is a network interface that connects an image data generation system and the site information.

The actual image data reflection rendering unit 30 stores various rendering models, and particularly, may apply an optimal rendering model to the posture data through a rendering engine by considering the property of the actual image data. Alternatively, image rendering may also be performed by combining optimal rendering models through the rendering engine.

The simulation based training unit 40 may generate image data 41 in which a change is applied for each step of the manufacturing process with respect to the intermediate output corresponding to the converted posture data of each image. In another exemplary embodiment, the simulation based training unit 40 may also generate a plurality of image data corresponding to a process progress rate 43 at a tight time interval. In yet another exemplary embodiment, the simulation based training unit 40 may also generate image data corresponding to the process progress rate 43 at a time interval set based on a process feature. That is, as the process is conducted, many intermediate outputs are generated, and in the case of a process of generating an image having a large change, the image data may be frequently generated, and in the case of a process in which a small change is generated, the image data may be minimally generated. As still yet another exemplary embodiment, among the converted posture data of each image, the image data having the large change may be frequently generated the image data corresponding to the process progress rate 43. In addition, in the case of data in which an image change is small in a direction of the converted posture data, even with the same process of image, a generation amount of the image data may also be optimized.

The image generation apparatus 100 may pre-store settings for the number of time and a generation time interval for generating the image data.

There is an image data corresponding to each step of the manufacturing process extracted from the 3D CAD data unit 10. The actual image data reflection rendering unit 30 reflects the actual image data to the image data. The simulation based training unit 40 may apply setting data of the site from the infrastructure network. Specifically, limited situations such as a specific direction a camera sensor of the infrastructure network faces and a surface of a block where the task is conducted are labeled on the image data as comments. Based on this, the simulation based training unit 40 may be trained.

The image data is an output which is extracted and processed from the 3D CAD data unit 10 and the actual image data reflection rendering unit 30. As a result, the simulation based learning training unit 40 performs an image simulation which satisfies a data attribute of an actual image site for the image, based on a database of the infrastructure network. Accordingly, a training range is narrowed, and the image data simulating the actual image of the site may be generated.

In the above example, stepwise site information may also be reflected to the actual image data of each process step. That is, in the actual image data reflection rendering unit 30 a light source at location X irradiates light to block A at the side of the manufacturing process. The simulation based training unit 40 may simulate the CAD image data by reflecting the case where the light source at location X irradiates light to each step of the manufacturing process of block A. To this end, at least one machine learning model widely known in the art to which the present disclosure pertains may be applied to the simulation based training unit 40.

As a modeling output of the machine learning model, the site information is reflected to the actual image data at real time. The simulation based training unit 40 may generate, in particular, image data to which the assembly state corresponding to the process progress rate is reflected. The process progress rate varies depending on site information such as weather or time zone of the manufacturing site, i.e., a situation in which the corresponding step starts and ends. Accordingly, the simulated image data may vary according to the site information, and image data in which the site information is reflected may be generated through the machine learning model.

The process monitoring unit 50 may compare the CAD image data for each step of the simulated manufacturing process with real data of a step 51 of a real-time manufacturing process of the data.

As a result, the process monitoring unit 50 may determine whether a detailed step of the manufacturing process is performed, in particular, whether the detailed step is performed according to a determined schedule, and whether real data maintains a predetermined similarity range to the simulated CAD image data for each step of the manufacturing process.

Figure 2:
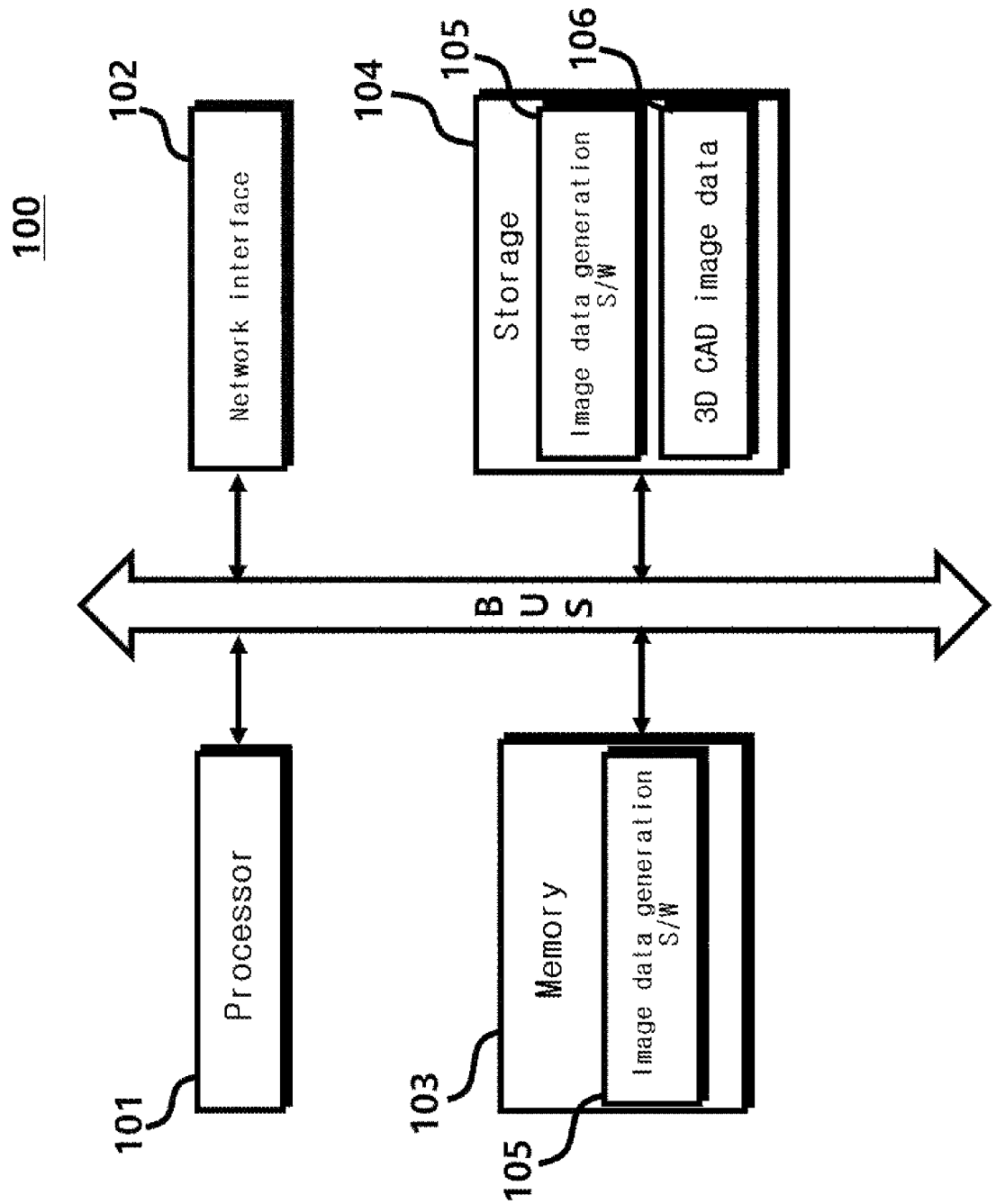
FIG. 2 is a block diagram of an apparatus for generating image data for machine learning according to another exemplary embodiment of the present disclosure.

FIG. 2 is a block diagram of an apparatus for generating image data for machine learning according to another exemplary embodiment of the present disclosure.

Referring to FIG. 2, the image data generation apparatus 100 may include one or more processors 101, a network interface 102 which is connected to an external device or receiving data from the external device, a memory 103 loading a computer program performed by the processor 101, and a storage 104 storing the computer program.

The processor 101 controls the overall operation of each component of the image data generation apparatus 100. The processor 101 may be configured to include a central processing unit (CPU), a micro processor unit (MPU), a micro controller unit (MCU), an application processor (AP), or any type of processor well-known in the technical field of the present disclosure. Further, the processor 101 may perform an operation of at least one application or program for executing the method according to the exemplary embodiments of the present disclosure.

The network interface 102 supports wired/wireless internet communication of the image data generation apparatus 100. Further, the network interface 102 may also support various communication schemes in addition to the internet which is a public communication network. In addition, the network interface 102 may also provide a connection with the external device. To this end, the network interface 102 may be configured to include at least one of a communication module and an access terminal which are well-known in the technical field of the present disclosure. In particular, according to the exemplary embodiment of the present disclosure, the network interface 102 may acquire, from the external device, at least one of 3D CAD image data among a finished product, a product, and an intermediate output, and also receive the real data and the process data.

Here, the external device, as a terminal which belongs to the infrastructure network, may be a server device storing the site information and/or various sensors of the manufacturing site. Further, the external device may also be at least some devices among the devices included in the image data generation apparatus of FIG. 1.

For example, the infrastructure network may mean a primary transmission path mutually transmitting a communication amount between a small-scale "local area network (LAN)" or a branch LAN. In particular, in the exemplary embodiment of the present disclosure, the infrastructure network means a network connected always or occasionally to an internal intranet of an enterprise performing the manufacturing process.

The external device according to the exemplary embodiment of the present disclosure is not limited thereto, and the external device may be a terminal that provides the 3D CAD image data.

The memory 103 stores various types of data, commands, and/or information. The memory 103 may load at least one program 105 from the storage 104 in order to execute the methods according to the exemplary embodiments of the present disclosure. The memory 103 may be, for example, RAM.

The storage 104 may non-temporarily store the at least one program 105 and 3D CAD image data 106. The at least one program may include a 3D CAD program, and include a program for exchanging and/or sharing data with a product lifecycle management (PLM) system and an enterprise resource planning (EPR) system. The program may provide an interface for sharing data through the network interface 102 from a server of a manufacturing enterprise performing the design process.

Further, although not illustrated, the storage 104 may store unique information of the ship, and a line number of the block. Further, the storage 104 may store information regarding a process step and an order of the ship and/or block, for example, a detailed assembly procedure (DAP), and also store the real data for each process step.

Figure 3:
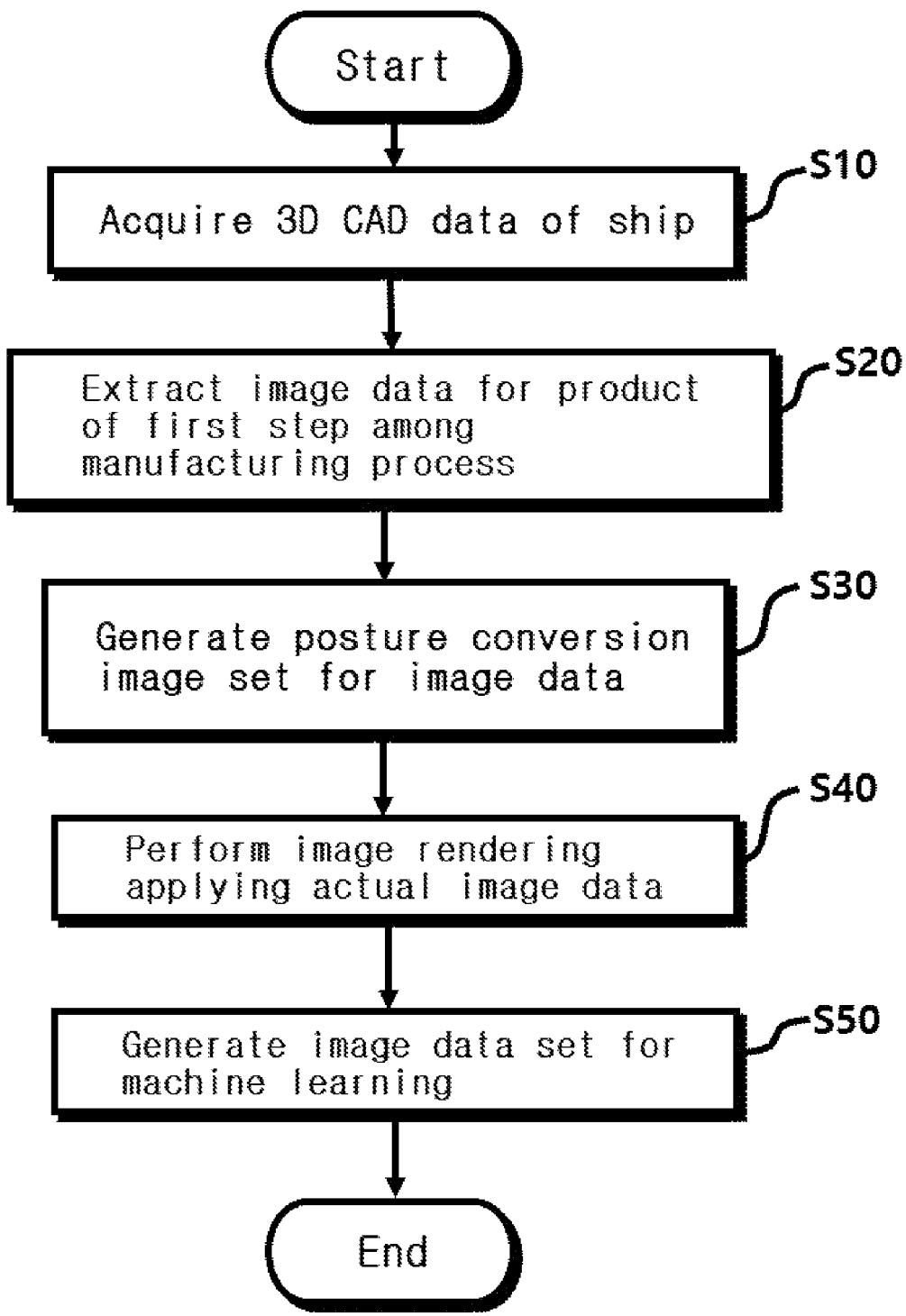
FIG. 3 is a flowchart of a method for generating image data for machine learning according to yet another exemplary embodiment of the present disclosure.

In FIG. 3, as an example of the at least one program 105, an image data generation software 105 is illustrated. The image data generation software 105 may also be referred to as an image data generation program.

Further, although not illustrated, at least one program 105 may also include a program for performing a light-weighting process of the 3D CAD model.

The storage 104 may be configured to include a nonvolatile memory such as a read only memory (ROM), an erasable programmable ROM (EPROM), an electrically erasable programmable ROM (EEPROM), and a flash memory, a hard disk, a removable disk, or any type of computer-readable recording medium well-known in the art to which the present disclosure belongs.

According to a first exemplary embodiment, the image data generation software 105 is computed by the image data generation apparatus 100 to generate image data in which the viewpoint of the product and/or the intermediate output are/is converted in various directions based on the 3D CAD image data 106.

According to a second exemplary embodiment, the image data generation software 105 is computed by the image data generation apparatus 100 to generate CAD image data to which site actual image data of the manufacturing process is applied based on the 3D CAD image data 106.

According to a third exemplary embodiment, the image data generation software 105 is computed by the image data generation apparatus 100 to generate CAD image data to which an assembly process of each step of the manufacturing process of the product is reflected based on the 3D CAD image data 106.

The first, second, and third exemplary embodiments may be combined with each other, and the 3D CAD image data may also store the image data generated in the exemplary embodiments.

For example, the 3D CAD image data (hereinafter, referred to as block A image data) corresponding to block A is rotated for each predetermined angle in 3D, and the corresponding image is captured to generate various posture data. The rotation angle may be set, for example, by each 1 degree of horizontal 360 degrees and vertical 180 degrees.

In the above example, the image data generation apparatus 100 may generate image data to which the actual image data and/or the process data are/is applied among the site data.

The actual image data may include, for example, a physical value, an environment value, and noise information. Further, when the 3D CAD image data is the image data of the block, the actual image data may also include a welding machine image applied to the process of the block as the noise information.

The process data may include at least one information of the type of each step of the manufacturing process of block A, a schedule, a level of the intermediate output, an assembly relationship between the intermediate outputs and an assembly order.

The image data generation apparatus 100 may generate image data to which the actual image data and/or the process data are/is applied. In the above example, for the actual image data and the process data, correlation information may be generated. As an example, in the manufacturing process of block A, a right surface is to be welded, the image data generation apparatus 100 identifies the type of process, and may render a welding machine image which is the noise information of the actual image data to be disposed at a right side of the block A.

To this end, the image data generation apparatus 100 may acquire, from the infrastructure network, data for the process of the ship and/or the block through the network interface 102. For example, the data for the process may be the detailed assembly procedure (DAP) of the block. The image data generation apparatus 100 identifies right welding of block A as the type of process in the detailed assembly procedure of the block, and matches with the welding machine image which is the noise information to store.

Meanwhile, according to an exemplary embodiment of the present disclosure, the image data generation software 105 may include a machine learning model for generating the 3D image data 106 by at least one of the first, second, and third exemplary embodiments. As the machine learning model is driven by the processor 101, the 3D image data 106 may also be generated by the at least one of the first, second, and third exemplary embodiments.

According to another exemplary embodiment of the present disclosure, the machine learning model is applied to the external device separated from the image data generation apparatus 100 to allow the external device to perform learning for the image data rendered by the image data generation apparatus 100.

Here, the machine learning model may include an artificial neural network, and may be configured to include at least one of a convolution neural network (CNN), an auto encoder, a feedforward neural network, a radial basis function network, a kohonen self-organizing network, and a recurrent neural network (RNN).

For example, when the machine learning model is by the convolution neural network (CNN), as the machine learning model is driven by the processor 101, a feature value of the 3D CAD image data 106 is filtered, and only a specific value among various image pixels is newly taken through convolution calculation. This is repeatedly learned to extract a desired feature point.

In an exemplary embodiment, the feature point may be an edge point of an appearance of the block.

The accumulated feature point extraction result data may be used as a feed data for the machine learning model.

According to the exemplary embodiment, the feature point is repeatedly extracted to associate a product or an intermediate output viewed in a specific direction with a specific step of the manufacturing process, and the image data generation apparatus 100 may determine an assembly degree of a specific intermediate output, i.e., the process progress rate.

Through this, as referenced in FIG. 1, the process may be monitored.

Ships built in a shipyard are designed in respective sizes and shapes, and it is very rare that an earlier built ship and a later built ship have the same shape. Furthermore, in most cases, the size and shape of the block that constitutes each ship also has unique values. As such, in the case of the product such as the ship which is difficult to mass-produce based on the ready-made product, it is often difficult to understand the progress rate of the manufacturing process at the site. In particular, in the case of the ship block, a direction and a surface in which the work is performed are different for each step, so the block is laid in a different direction for each step.

In this case, even though a manager of the site have much experiences in manufacturing the existing ship, there is a problem in that it is difficult to understand up to which process a detailed assembly is made when a block having a new size and a new shape is laid in a specific direction. However, in order to solve such a problem, even though a site photo of the past built ship is compared, a specific-direction assembly step of a ship which is currently being assembled is difficult to be matched with a past site photo even in this case.

On the other hand, in the exemplary embodiment of the present disclosure, image data which may be comparable with the site is generated based on the 3D CAD image data to analyze the progress rate for each step of the manufacturing process of the product. In particular, the image data generating apparatus 100 of the present disclosure may generate an image data in which the actual image data in the site is simulated, the process data is reflected to be trained, and an assembly state for each step is reflected.

FIG. 3 is a flowchart of a method for generating image data for machine learning according to yet another exemplary embodiment of the present disclosure. Hereinafter, each step of FIG. 3 is performed by the image data generation apparatus 100. Specifically, each step is performed as the image data generation software 105 is computed by the processor 101 of FIG. 2. In particular, a case where the 3D CAD image data according to the exemplary embodiment of the present disclosure is the design drawing data of the ship will be described as an example.

Referring to FIG. 3, the image data generation apparatus 100 may acquire 3D CAD image data of the ship in step S10. The image data generation apparatus 100 may be shared with the 3D CAD image data of the ship from the network interface 102, or may acquire data from the external device.

The image data generation apparatus 100 may extract the image data for the output of the first step during the manufacturing process in step S20. Specifically, by acquiring the detailed assembly procedure (DAP) from the database of the infrastructure network, the image data generation apparatus 100 may extract image data corresponding to the output of the first step.

The image data generation apparatus 100 may generate a posture conversion image set for the extracted image data in step S30. The image data generation apparatus 100 may generate the posture conversion image set by rotating the image data for the first step in the three axis directions of X, Y, and Z. At this time, the image set may be generated by discontinuously performing rotation at a predetermined angle unit.

Next, the image data generating apparatus 100 performs the image rendering by applying the actual image data for each image included in the posture conversion image set in step S40.

In this case, the type of actual image data may be limited to the site information, and accordingly, an image data set for performing machine learning may be generated in step S50. In the image data generation apparatus 100, the image data set for machine learning may perform a limited learning with the site information, thereby limiting the range of machine learning and quickly generating simulation data for each step of the manufacturing process.

According to the exemplary embodiment of the present disclosure, in the step S40, the image data generation apparatus 100 generates the simulation data generated based on the site information extracted by filtering based on the process information, and may perform image rendering by applying the simulation data to each image included in the posture conversion image set.

Figure 4:
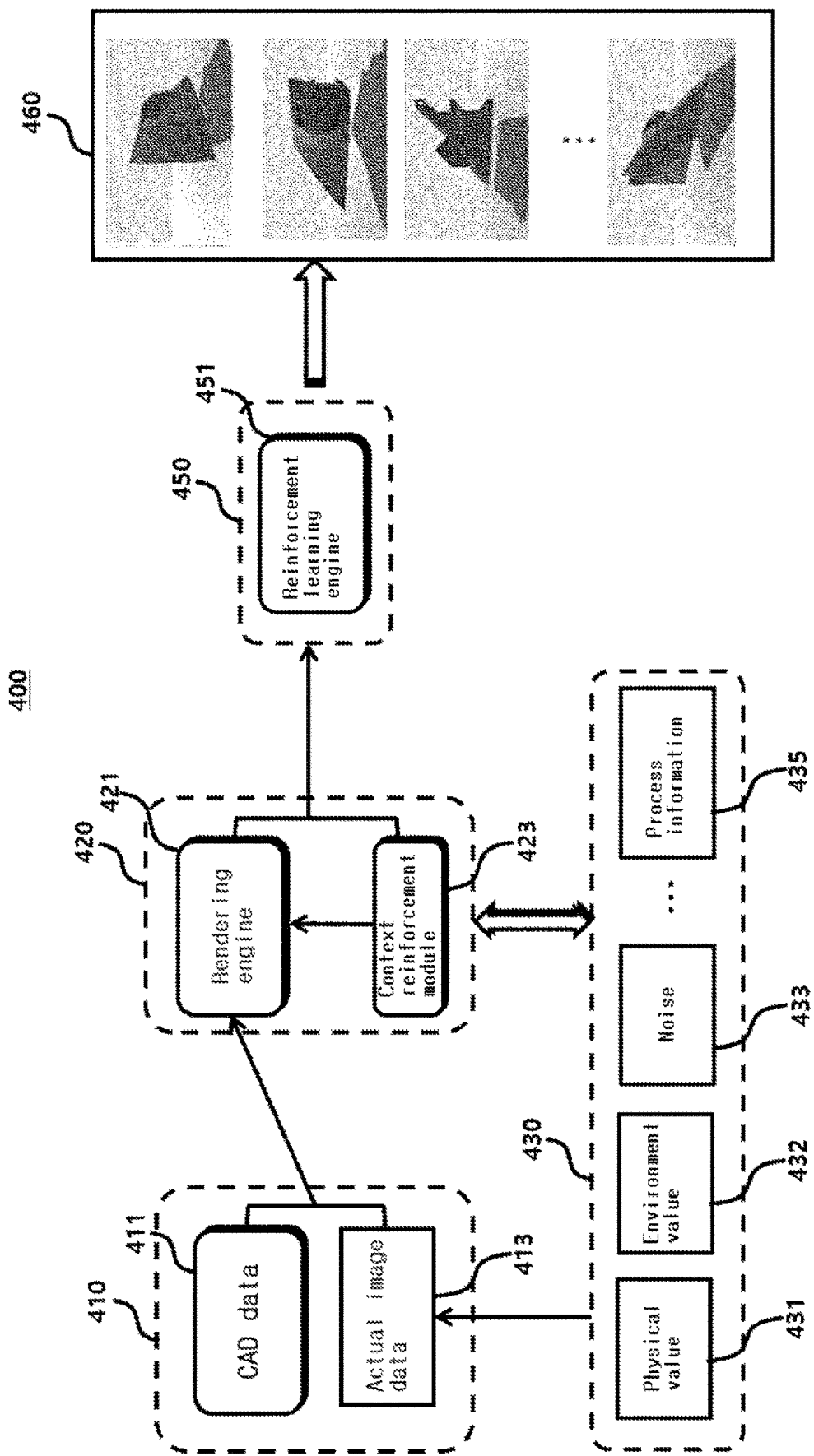
FIG. 4 is a block diagram for describing a machine learning image data generation software structure referred in some exemplary embodiments of the present disclosure.
Figure 5:
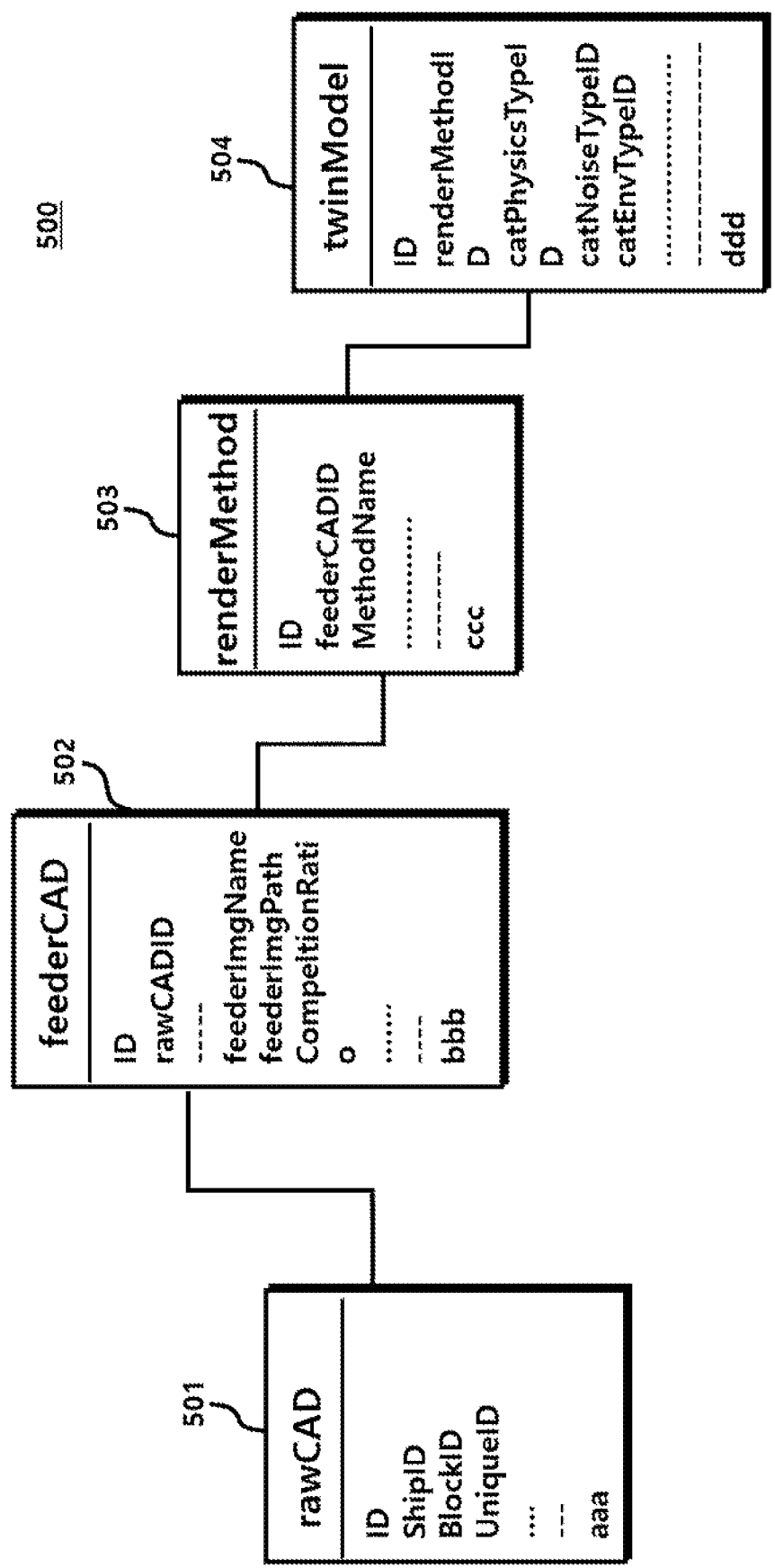
FIG. 5 is an exemplary diagram for describing a database for generating image data for machine learning, which is referred in some exemplary embodiments of the present disclosure.
Figure 6A:
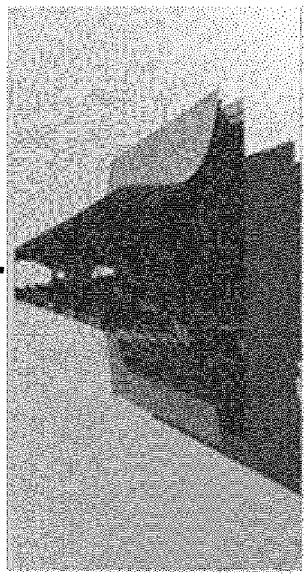
FIGS. 6A-6D are exemplary diagrams of learning image data, which is referred in some exemplary embodiment of the present disclosure.
Figure 6B:
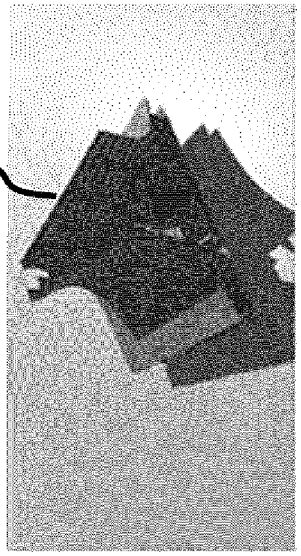
Figure 6C:
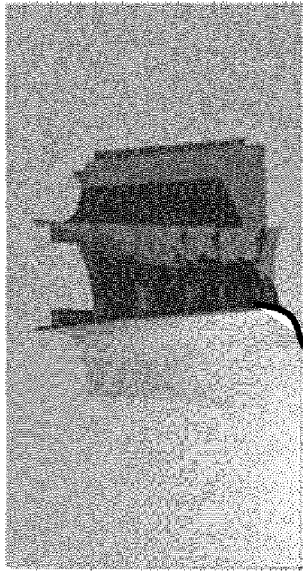
Figure 6D:
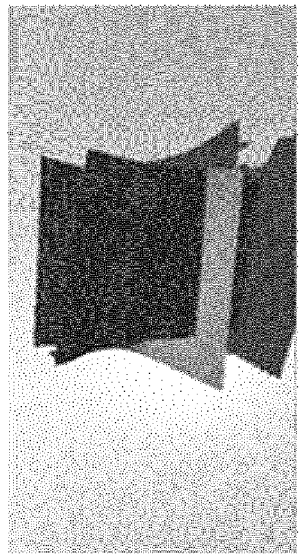

FIG. 4 is a block diagram for describing a machine learning image data generation software structure referenced in some exemplary embodiments of the present disclosure. FIG. 5 is an exemplary diagram for describing a database for generating image data for machine learning, which is referenced in some exemplary embodiments of the present disclosure.

Referring to FIGS. 4 and 5, a computation process by the image generation software and a database therefor are described.

Referring to FIG. 5, raw CAD data rawCAD 501 may be 3D CAD image data for the ship. Alternatively, the rawCAD 501 may be 3D CAD image data for a specific block. All or some data of the rawCAD 501 may be acquired from the database of the infrastructure network, and may include unique identification information, ship identification information, block identification information, data input person information, a comment, and final renewal day information. For example, the unique identification information may be generated by mapping the ship identification information and the block identification information.

The rawCAD 501 may be linked to feeder CAD data feederCAD 502. The feederCAD 502 may include progress rate information of the manufacturing process of the block, rawCAD data information, the unique identification information, information about the machine learning model to be fed, and information on a path to be fed. In an exemplary embodiment, the feederCAD 502 may also include information about the detailed step in which the feederCAD belongs during the manufacturing process.

Referring to FIG. 4, CAD data 511 is input into a rendering module 420 as input data 410. In this case, the CAD data 511 may be image data matched to the feederCAD 502. In this case, the input data 410 may include actual image data 413.

The actual image data 413 is information for simulating the CAD image data close to the real data, according to an exemplary embodiment, and the actual image data 413 may include at least some data of site information 430 such as a physical value 431, an environment value 432, noise 433, and process information 435.

In another exemplary embodiment, the actual image data 413 may be simulation data generated by granting a weight to specific data among the site information 430, and filtering some data according to a condition.

For example, the image data generation apparatus 100 may receive site information and filter the site information based on the process information. Specifically, the image data generation apparatus 100 may extract pre-matched noise information based on at least one of the process type and the progress direction of the process among the process information, and filter the site information based on the pre-matched noise information. That is, as described above, when the manufacturing process of block A is the welding the right surface, the image data generation apparatus 100 may filter the site information pre-matched with a welding machine disposed at a right side, which is the noise information. The image data generation apparatus 100 may generate the simulation data based on the filtered site information.

In yet another exemplary embodiment, a weight function that gives the weight to specific data of the site information 430 or a filter for filtering with respect to some data may be acquired through machine learning, and such machine learning may be performed by a context reinforcement module 423. The weight and the filtering algorithm may be simulation data generated through the machine learning.

Referring back to FIG. 5, a render method renderMethod 503 may include identification information, feederCAD data unique information, and information on an applied rendering model. The renderMethod 503 may include information on a rendering model determined by the rendering engine 421 and applied to input data 410 after the CAD data 411 and the actual image data 413 matched with the feederCAD 502 are input into the rendering module 420.

As a result, the image data generation apparatus 100 may track CAD data information, an actual image data application value, and the applied rendering model for the image data fed to the machine learning model 450. Further, a reinforcement learning engine 451 of the machine learning model 450 may perform learning of a range limited to specific site information based on a relationship between databases and data of each table in FIG. 5. Accordingly, there is an advantage in that the time and resource utilization of the machine learning may be optimized. The output image data 460 may be utilized as comparison target data with a real object in the process of monitoring the process progress rate at the site of the manufacturing process.

Referring back to FIG. 5, a twin model twinModel 504 may include the identification information, the information on the rendering model, the physical value, noise, and identification information for the environment value. That is, the twinModel 504 may be matched with rendering image data input into the machine learning model 450.

In FIG. 4, when the actual image data 413 is input into the rendering module 420 jointly with the CAD data 410, the rendering engine 321 performs image processing and the rendered image is output. In this process, the context reinforcement module 423 filters data of the specific site information 430 or gives the weight to the rendering engine to be involved in the image processing of the rendering engine.

The context reinforcement module 423 may include at least one machine learning model, and apply a trained value based on the site information, in particular, the process information to a result of the rendering engine 421.

FIGS. 6A-6D are exemplary diagrams of learning image data, which is referenced in some exemplary embodiment of the present disclosure. Referring to FIGS. 6A-6D, the image data generation apparatus 100 may generate 3D CAD image data of a specific structure constituting a block. In particular, a case where through posture conversion, image data 601, 602, 603, and 604 of different directions are generated is illustrated as an example. The image data 601, 602, 603, and 604 may be an intermediate output in an uncompleted assembly step. The image data generation apparatus 100 may determine the progress rate for the assembly step of the manufacturing process by confirming the image data for the structure in various directions.

The methods according to the exemplary embodiment of the present disclosure described with reference to the accompanying drawings may be performed by the execution of a computer program implemented in a computer-readable code. The computer program may be transmitted to a second computing device from a first computing device through a network such as the internet and installed in the second computing device, thereby being used in the second computing device. The first computing device and the second computing device include both fixed computing devices such as a server device and a desktop PC and mobile computing devices such as a laptop, a smartphone and a tablet PC.

Hereinabove, the embodiments of the present disclosure have been described with the accompanying drawings, but it may be understood by those skilled in the art that the present disclosure may be executed in other detailed forms without changing the technical spirit or requisite features of the present disclosure. Therefore, it should be understood that the above-described embodiments are illustrative in all aspects and do not limit the present disclosure.

The invention claimed is:

1. A method for generating image data for machine learning, which is performed by an apparatus for generating image data for machine learning, the method comprising:
   extracting first image data for a product generated as a result of conducting a first step among a plurality of steps of the manufacturing process of the product, based on 3D CAD data for the product;
   generating a plurality of posture conversion image sets corresponding to a plurality of postures for the product, respectively, based on the first image data;
   performing image processing through a rendering engine by applying actual image data to respective images of the plurality of posture conversion image sets; and
   generating a learning data set for the first image data through the image processing,
      wherein the performing the image processing through the rendering engine by applying the actual image data includes:
   receiving physical value information, environment value information, and noise information corresponding to the first step from an infrastructure network database storing a site information corresponding to the first step; and
   generating the actual image data based on the physical value information, the environment value information, and the noise information.

2. The method for generating image data for machine learning of claim 1, wherein the extracting the first image data includes,
   matching the 3D CAD data for the product with a first data group including identification information of the product, identification information of a finished product including the product, and information on each step of the manufacturing process.

3. The method for generating image data for machine learning of claim 1, wherein the extracting the first image data includes,
   matching the first image data with a second data group including identification information of the product, identification information of an intermediate output constituting the product, and information on a process progress rate of the first step compared with the plurality of steps of the manufacturing process.

4. The method for generating image data for machine learning of claim 1, wherein the generating the plurality of posture conversion image sets includes,
performing predetermined viewpoint conversion for the first image data, and capturing the viewpoint-converted first image data.

5. The method for generating image data for machine learning of claim 1, wherein the performing the image processing through the rendering engine includes:
determining a rendering model based on the plurality of posture conversion image sets and the actual image data;
performing the image processing based on the rendering model;
generating a third data group including the applied actual image data and information on the rendering model; and
matching the third data group with a learning data set for the first image data.

6. The method for generating image data for machine learning of claim 5, wherein the site information includes process information corresponding to the first step, and the method includes:
filtering the site information based on the process information; and
performing reinforcement learning for the learning data set based on the site information, and
the performing the reinforcement learning includes:
generating simulation data to be applied to learning data through pre-registered reinforcement learning model based on the site information; and
applying the simulation data to the learning data set.

7. The method for generating image data for machine learning of claim 6, wherein the process information includes at least one of a type of process corresponding to the first step, a progress direction of the process, and information on a work target surface of an intermediate output.

8. The method for generating image data for machine learning of claim 7, wherein the filtering the received site information based on the process information includes:
extracting pre-matched noise information based on at least one of a type of process type and a progress direction of the process among the process information; and
filtering the site information based on the pre-matched noise information.

9. The method for generating image data for machine learning of claim 1, wherein the extracting the first image data includes:
identifying a hierarchy of the 3D CAD model for the product;
performing a CAD light-weighting process of light-weighting an object determined as a merge target among objects constituting the hierarchy; and
generating the 3D CAD data of the product by performing the CAD light-weighting process.

10. The method for generating image data for machine learning of claim 9, wherein the performing the CAD light-weighting process of light-weighting the object determined as the merge target among the objects constituting the hierarchy includes,
determining the merge target among the objects based on the manufacturing process of the product.

11. The method for generating image data for machine learning of claim 1, further comprising:
extracting second image data for a product generated as a result of conducting a second step among the plurality of steps of the manufacturing process of the product;
generating a plurality of posture conversion image sets of the second image data corresponding to a plurality of postures for the product, respectively, based on the second image data;
performing image processing through a rendering engine by applying actual image data to respective images of the plurality of posture conversion image sets of the second image data; and
generating a learning data set for the second image data through the image processing.

12. An apparatus for generating image data for machine learning, the apparatus comprising:
one or more processors;
a network interface receiving 3D CAD data for a product and a site information;
a memory loading a computer program executed by the processor; and
a storage storing the computer program,
wherein the computer program includes:
an operation of extracting first image data for a product generated as a result of conducting a first step among a plurality of steps of the manufacturing process of a product based on the 3D CAD data;
an operation of generating a plurality of posture conversion image sets corresponding to a plurality of postures for the product, respectively, based on the first image data;
an operation of performing image processing through a rendering engine by applying actual image data to respective images of the plurality of posture conversion image sets; and
an operation of generating a learning data set for the first image data through the image processing,
wherein the operation of the performing the image processing through the rendering engine by applying the actual image data includes:
receiving physical value information, environment value information, and noise information corresponding to the first step from an infrastructure network database storing the site information corresponding to the first step; and
generating the actual image data based on the physical value information, the environment value information, and the noise information.

\* \* \* \* \*